ns(12) United States Patent
Shroff et al.

(10) Patent No.: US 9,471,728 B2
(45) Date of Patent: Oct. 18, 2016

(54) METRICS FOR DESIGNING A PLENOPTIC IMAGING SYSTEM

(71) Applicants: Sapna A. Shroff, Menlo Park, CA (US); Kathrin Berkner, Los Altos, CA (US); David G. Stork, Portola Valley, CA (US)

(72) Inventors: Sapna A. Shroff, Menlo Park, CA (US); Kathrin Berkner, Los Altos, CA (US); David G. Stork, Portola Valley, CA (US)

(73) Assignee: Ricoh Company, Ltd., Tokyo (JP)

( * ) Notice: Subject to any disclaimer, the term of this patent is extended or adjusted under 35 U.S.C. 154(b) by 440 days.

(21) Appl. No.: 14/022,074

(22) Filed: Sep. 9, 2013

(65) Prior Publication Data

US 2014/0019098 A1 Jan. 16, 2014

Related U.S. Application Data

(62) Division of application No. 13/113,952, filed on May 23, 2011, now Pat. No. 8,531,581.

(51) Int. Cl.
*G06F 17/50* (2006.01)
*H04N 5/232* (2006.01)
*G02B 7/38* (2006.01)

(52) U.S. Cl.
CPC ........... *G06F 17/5009* (2013.01); *G02B 7/38* (2013.01); *H04N 5/23212* (2013.01)

(58) Field of Classification Search
CPC ............. H04N 5/23212; H04N 5/238; H04N 5/2254; H04N 5/23229; G02B 7/38; G06F 17/5009
USPC ........................... 703/1; 348/340, 345, 240.3
See application file for complete search history.

(56) References Cited

U.S. PATENT DOCUMENTS

| 5,629,765 | A | 5/1997 | Schmutz |
| 5,659,420 | A | 8/1997 | Wakai et al. |
| 5,729,011 | A | 3/1998 | Sekiguchi |
| 6,838,650 | B1 | 1/2005 | Toh |
| 7,620,309 | B2 | 11/2009 | Georgiev |
| 7,723,662 | B2 | 5/2010 | Levoy et al. |
| 7,732,744 | B2 | 6/2010 | Utagawa |
| 7,949,252 | B1 | 5/2011 | Georgiev |
| 7,956,924 | B2 | 6/2011 | Georgiev |
| 7,962,033 | B2 | 6/2011 | Georgiev et al. |
| 7,965,936 | B2 | 6/2011 | Raskar et al. |
| 8,189,065 | B2 | 5/2012 | Georgiev et al. |
| 8,189,089 | B1 | 5/2012 | Georgiev et al. |
| 8,228,417 | B1 | 7/2012 | Georgiev et al. |
| 8,288,704 | B2 | 10/2012 | Perlman et al. |
| 8,290,358 | B1 | 10/2012 | Georgiev |
| 2003/0231255 | A1 | 12/2003 | Szajewski et al. |

(Continued)

FOREIGN PATENT DOCUMENTS

| JP | 2009-229125 A | 10/2009 |
| JP | 2010-178333 A | 8/2010 |
| JP | 2011-027901 A | 2/2011 |

OTHER PUBLICATIONS

European Extended Search Report, European Application No. 12164663.2, Sep. 23, 2013, 7 pages.

(Continued)

*Primary Examiner* — Eunhee Kim
(74) *Attorney, Agent, or Firm* — Fenwick & West LLP (57) ABSTRACT

Metrics for characterizing the focusing of a plenoptic imaging system. In one aspect, the metric is based on the high frequency content and/or the blurring of the plenoptic image.

20 Claims, 6 Drawing Sheets

(56) References Cited

U.S. PATENT DOCUMENTS

| | | |
|---|---|---|
| 2007/0091197 A1 | 4/2007 | Okayama et al. |
| 2007/0252074 A1 | 11/2007 | Ng et al. |
| 2008/0131019 A1 | 6/2008 | Ng |
| 2008/0152215 A1 | 6/2008 | Horie et al. |
| 2008/0165270 A1 | 7/2008 | Watanabe et al. |
| 2008/0187305 A1 | 8/2008 | Raskar et al. |
| 2008/0193026 A1 | 8/2008 | Horie et al. |
| 2009/0041381 A1 | 2/2009 | Georgiev et al. |
| 2009/0041448 A1* | 2/2009 | Georgiev ............... H04N 5/225 396/268 |
| 2009/0140131 A1 | 6/2009 | Utagawa |
| 2009/0185801 A1 | 7/2009 | Georgiev et al. |
| 2009/0295829 A1 | 12/2009 | Georgiev et al. |
| 2010/0026852 A1 | 2/2010 | Ng et al. |
| 2010/0085468 A1 | 4/2010 | Park et al. |
| 2010/0141802 A1 | 6/2010 | Knight et al. |
| 2010/0194926 A1 | 8/2010 | Kang et al. |
| 2010/0265386 A1 | 10/2010 | Raskar et al. |
| 2010/0277629 A1 | 11/2010 | Tanaka |
| 2011/0129165 A1 | 6/2011 | Lim et al. |
| 2011/0149125 A1 | 6/2011 | Morimoto |
| 2011/0199458 A1 | 8/2011 | Hayasaka et al. |
| 2012/0050562 A1 | 3/2012 | Perwass et al. |
| 2012/0050589 A1 | 3/2012 | Ueno et al. |
| 2012/0127351 A1 | 5/2012 | Vlutters et al. |
| 2012/0177356 A1 | 7/2012 | Georgiev et al. |
| 2012/0229679 A1 | 9/2012 | Georgiev et al. |
| 2012/0249819 A1 | 10/2012 | Imai |
| 2013/0057749 A1 | 3/2013 | Hiasa et al. |
| 2013/0128069 A1* | 5/2013 | Georgiev ........... H04N 5/23212 348/222.1 |

OTHER PUBLICATIONS

U.S. Appl. No. 13/113,952, Oct. 26, 2012, 25 pages.
Japanese Office Action, Japanese Application No. 2012-116519, Mar. 29, 2016, 9 pages (with concise explanation of relevance).

* cited by examiner

150 Object — 910 Primary lens — 932 Sensor

Fig. 9a (prior art)

150 Object — 910 Primary lens — 120 Lenslet Array — 130 Sensor

METRICS FOR DESIGNING A PLENOPTIC IMAGING SYSTEM

CROSS-REFERENCE TO RELATED APPLICATION(S)

This application is a division of U.S. patent application Ser. No. 13/113,952, "Focusing and Focus Metrics for a Plenoptic Imaging System," filed May 23, 2011 and issued on Sep. 10, 2013 and U.S. Pat. No. 8,531,581. The subject matter of the foregoing is incorporated herein by reference in its entirety.

BACKGROUND OF THE INVENTION

1. Field of the Invention

This invention relates generally to plenoptic imaging systems, and more particularly to designing plenoptic imaging systems.

2. Description of the Related Art

The plenoptic imaging system has recently received increased attention. It can be used to recalculate a different focus point or point of view of an object, based on digital processing of the captured plenoptic image. The plenoptic system also finds application in multi-modal imaging, using a multi-modal filter array in the plane of the pupil aperture. Each filter is imaged at the sensor, effectively producing a multiplexed image of the object for each imaging modality at the filter plane. Other applications for plenoptic imaging systems include varying depth of field imaging and high dynamic range imaging.

However, there is limited literature on the optical design of a plenoptic imaging system that goes beyond geometric optics considerations. Thus far, most of the literature about these systems is concentrated in the areas of computer vision, graphics and digital processing algorithms—how to further process the "light field" properties of the data captured at the sensor of a plenoptic system. These algorithms focus on what to do with the plenoptic images after they are captured. In addition, many of those algorithms are not specific to plenoptic imaging systems; they can be directly transferred to completely different configurations, such as multi-lens imaging systems (multiple cameras mounted adjacent to one another). This body of work assumes that the plenoptic imaging system has been well designed, manufactured and assembled. However, there is not much literature explaining how to actually design, manufacture or assemble plenoptic imaging systems.

As one example, consider the "focusing" a plenoptic imaging system. Much is known about how to focus a conventional imaging system, in order to produce a sharp image of the object at the sensor. However, a plenoptic imaging system that is "in focus" does not produce a sharp image of the object at the sensor array. In a plenoptic imaging system, the sensor array is not placed at a plane conjugate to the image plane. Therefore, conventional focusing criteria are not appropriate for focusing a plenoptic system. In order to design a plenoptic system, including diffraction effects, it is desirable to obtain an appropriate evaluation metric that can be used to gauge the quality of the system.

Thus, there is need for such criteria.

SUMMARY OF THE INVENTION

The present invention overcomes the limitations of the prior art by providing approaches to adjust the axial spacing (i.e., "defocus") of components in a plenoptic imaging system based on the plenoptic image captured by the sensor array.

A plenoptic imaging system includes a primary imaging subsystem, a secondary imaging array, and a sensor array. A plenoptic imaging system that is "in focus" will not produce a sharp image of the object at the sensor array. Thus, focusing metrics different from those used in conventional imaging systems are required. In one approach, the axial position of the secondary imaging array relative to the primary imaging subsystem is adjusted based on increasing a high frequency content in the plenoptic image captured by the sensor array. In different variations, this is achieved by using metrics based on the frequency of ringing in the plenoptic image, on the number of ripples caused by ringing in the plenoptic image, or on the flatness or contrast of ringing in the plenoptic image.

Furthermore, the axial position of the sensor array relative to the secondary imaging array can be adjusted based on reducing a blur in a pupil image function of the plenoptic imaging system. In addition, the distance to the object can be estimated once the in-focus positions of the secondary imaging array and/or sensor array have been determined.

These principles can also be used in other ways. For example, they can be used as the basis for a plenoptic imaging system with autofocus capability. Alternately, they can be used to retrofit a plenoptic sensor module (i.e., secondary imaging array plus sensor array) onto an existing imaging system. As a final example, merit functions based on the plenoptic image can be used in the design process for the plenoptic imaging system.

Other aspects of the invention include methods, devices, systems and applications related to the principles described above.

BRIEF DESCRIPTION OF THE DRAWINGS

The invention has other advantages and features which will be more readily apparent from the following detailed description of the invention and the appended claims, when taken in conjunction with the accompanying drawings, in which:

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Sample Configuration.

Figure 1:
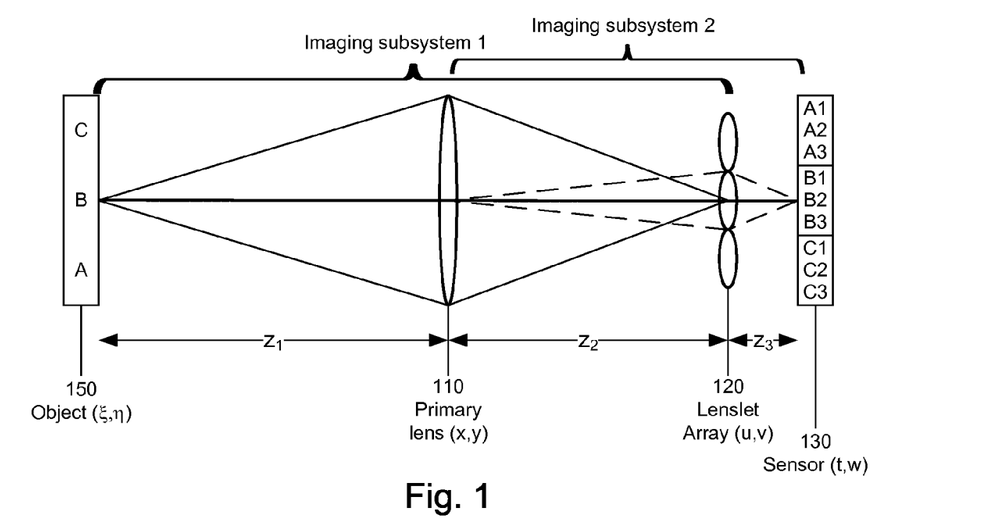
FIG. 1 is a simplified diagram of a plenoptic imaging system.

FIG. 1 is a simplified diagram of a plenoptic imaging system. The system includes a primary imaging subsystem 110 (represented by a single lens in FIG. 1), a secondary imaging array 120 (represented by a lenslet array) and a sensor array 130. These form two overlapping imaging subsystems, referred to as subsystem 1 and subsystem 2 in FIG. 1.

The spatial coordinates $(\xi, \eta)$ will be used at the object plane, $(x, y)$ at the pupil plane for imaging subsystem 1, $(u, v)$ at the plane of the lenslet array, and $(t, w)$ at the sensor plane. The primary lens is a distance $z_1$ from the object, the lenslet array is a distance $z_2$ from the primary lens, and the sensor is a distance $z_3$ from the lenslet array. In FIG. 1, the different components are each located at a single plane so the distances between components is easy to define. However, in other systems, the different components may be more complex (e.g., the primary "lens" may be a set of lenses), but the concept of the distances $z_1$, $z_2$, $z_3$ can be generalized using known principles. The focal lengths of the primary lens and the lenslet array are represented by $f_1$ and $f_2$ and their diameters are $D_1$ and $D_2$, respectively. In addition, the different components do not have to be designed exactly as shown in FIG. 1. For example, the "primary lens" could be various combinations of elements, including lenses, mirrors and combinations of the two. Similarly, the secondary imaging array could be a pinhole array, or a reflective array.

In imaging subsystem 1, the object 150 is imaged by the primary lens 110 to produce an image that will be referred to as the "primary image." This primary lens 110 may be a camera imaging lens, microscope objective lens or any other such imaging system. The lenslet array 120 is placed approximately at the location of the primary image. Each lenslet then images the pupil of the primary lens to the sensor plane. This is imaging subsystem 2, which partially overlaps with imaging subsystem 1. The image created at the sensor array 130 will be referred to as the "plenoptic image" in order to avoid confusion with the "primary image." The plenoptic image can be divided into an array of subimages, corresponding to each of the lenslets. Note, however, that the subimages are images of the pupil of imaging subsystem 1, and not of the object 150.

Wave Propagation Analysis.

Now analyze this system based on wave propagation. Consider the first imaging subsystem, where the primary lens has a generalized pupil function $P_1$. Its corresponding impulse response is given by $$h_1(u, v; \xi, \eta) = \frac{e^{jkz_1}}{\lambda^2 z_1 z_2} \exp\left[\frac{jk}{2z_2}(u^2 + v^2)\right] \exp\left[\frac{jk}{2z_1}(\xi^2 + \eta^2)\right] \quad (1)$$

$$\int\int dx\,dy\, P_1(x, y) \exp\left[\frac{jk}{2}\left(\frac{1}{z_1} + \frac{1}{z_2} - \frac{1}{f_1}\right)(x^2 + y^2)\right]$$

$$\exp\left\{-\frac{jk}{z_2}[(u - M\xi)x + (v - M\eta)y]\right\},$$

where $\lambda$ is the wavelength of imaging, $k = 2\pi/\lambda$ and the magnification from object to image plane is given by $M = -z_2/z_1$. Substituting, $x' = x/\lambda z_2$ and $y' = y/\lambda z_2$ in the integral in Eq. (1) yields $$\lambda^2 z_1 z_2 \int\int dx'\,dy'\, P_1(x'\lambda z_2, y'\lambda z_2) \quad (2)$$

$$\exp\left\{\frac{jk}{2}\left(\frac{1}{z_1} + \frac{1}{z_2} - \frac{1}{f_1}\right)[(x'\lambda z_2)^2 + (y'\lambda z_2)^2]\right\}$$

$$\exp\{-j2\pi[(u - M\xi)x' + (v - M\eta)y']\} =$$

$$\lambda^2 z_1 z_2 FT\bigg(P_1(x'\lambda z_2, y'\lambda z_2)\exp$$

$$\left\{\frac{jk}{2}\left(\frac{1}{z_1} + \frac{1}{z_2} - \frac{1}{f_1}\right)[(x'\lambda z_2)^2 + (y'\lambda z_2)^2]\right\}\bigg)\bigg|_{\substack{fx=(u-M\xi)\\fy=(v-M\eta)}} =$$

$$\lambda^2 z_1 z_2 h_1'(u - M\xi, v - M\eta)$$

where we have defined the term $h_1'$ for convenience as $$h_1'(u, v) = \quad (3)$$

$$FT\bigg(P_1(x\lambda z_2, y\lambda z_2)\exp\left\{\frac{jk}{2}\left(\frac{1}{z_1} + \frac{1}{z_2} - \frac{1}{f_1}\right)[(x\lambda z_2)^2 + (y\lambda z_2)^2]\right\}\bigg)$$

This reduces Eq. (1) to $$h_1(u, v; \xi, \eta) = \quad (4)$$

$$e^{jkz_1} \exp\left[\frac{jk}{2z_2}(u^2 + v^2)\right] \exp\left[\frac{jk}{2z_1}(\xi^2 + \eta^2)\right] h_1'(u - M\xi, v - M\eta).$$

An object having a complex field $U_o$ then produces an image at the plane of the lenslet array, given by, $$U_i(u, v) = \int\int d\xi\, d\eta\, h_1(u, v; \xi, \eta) U_o(\xi, \eta) \quad (5)$$

Using Eqs. (4) and (5) and substituting $\xi' = M\xi$ and $\eta' = M\eta$ yields $$U_i(u, v) = \frac{e^{jkz_1}}{M^2} \exp\left[\frac{jk}{2z_2}(u^2 + v^2)\right] \int\int d\xi'\,d\eta'\, U_o\left(\frac{\xi'}{M}, \frac{\eta'}{M}\right) \quad (6)$$

$$\exp\left\{\frac{jk}{2z_1}\left[\left(\frac{\xi'}{M}\right)^2 + \left(\frac{\eta'}{M}\right)^2\right]\right\} h_1'(u - \xi', v - \eta').$$

The above equation can be written as a convolution (indicated by the symbol *):

$$U_i(u, v) = \frac{e^{jk_1}}{M^2} \exp\left[\frac{jk}{2z_2}(u^2 + v^2)\right] \quad (7)$$

$$\left\{\left[U_o\left(\frac{u}{M}, \frac{v}{M}\right) \exp\left\{\frac{jk}{2z_1}\left[\left(\frac{u}{M}\right)^2 + \left(\frac{v}{M}\right)^2\right]\right\}\right] * h_1'(u, v)\right\}.$$

This yields the field of the first image formed by the primary lens at the plane of the lenslet array.

We assume each lenslet has a diameter $D_2$, focal length $f_2$, pupil function given by $P_2$ and there are $M'\times N'$ such lenslets in the array. Then the amplitude distribution of the field $U_i$ after the lenslet array may be written as $$U_i'(u,v) = U_i(u,v) \sum_{m\in M'} \sum_{n\in N'} P_2(u-mD_2, v-nD_2) \qquad (8)$$

$$\exp\left\{\frac{-jk}{2f_2}[(u-mD_2)^2 + (v-nD_2)^2]\right\}.$$

Using the Fresnel transform to propagate this field to the sensor, which is located a distance $z_3$ from the lenslet array, yields $$U_f(t,w) = \frac{e^{jkz_3}}{j\lambda z_3}\exp\left[\frac{jk}{2z_3}(t^2+w^2)\right] \qquad (9)$$

$$\sum_{m\in M'} \sum_{n\in N'} \int\int du\,dv\, U_i(u,v) P_2(u-mD_2, v-nD_2)$$

$$\exp\left\{\frac{-jk}{2f_2}[(u-mD_2)^2 + (v-nD_2)^2]\right\}$$

$$\exp\left[\frac{jk}{2z_3}(u^2+v^2)\right]\exp\left[\frac{-jk}{z_3}(ut+vw)\right].$$

Further simplification gives $$U_f(t,w) = \qquad (10)$$

$$\frac{e^{jkz_3}}{j\lambda z_3}\exp\left[\frac{jk}{2z_3}(t^2+w^2)\right] \sum_{m\in M'}\sum_{n\in N'} \exp\left\{\frac{-jk}{2f_2}[(mD_2)^2+(nD_2)^2]\right\}$$

$$FT\Big\{U_i(u,v)P_2(u-mD_2, v-nD_2)$$

$$\exp\left[\frac{jk}{2}\left(\frac{1}{z_3}-\frac{1}{f_2}\right)(u^2+v^2)\right]\Big\}\Big|_{\substack{f_x=\frac{t}{\lambda z_3}-\frac{mD_2}{\lambda f_2}\\ f_y=\frac{w}{\lambda z_3}-\frac{nD_2}{\lambda f_2}}}$$

Using Eq. (10), the plenoptic image captured at the sensor is given by, $$I_f(t,w) = \qquad (11)$$

$$\left|\frac{e^{jkz_3}}{j\lambda z_3}\exp\left[\frac{jk}{2z_3}(t^2+w^2)\right]\sum_{m\in M'}\sum_{n\in N'}\exp\left\{\frac{-jk}{2f_2}[(mD_2)^2+(nD_2)^2]\right\}\right.$$

$$FT\Big\{U_i(u,v)P_2(u-mD_2, v-nD_2)$$

$$\left.\exp\left[\frac{jk}{2}\left(\frac{1}{z_3}-\frac{1}{f_2}\right)(u^2+v^2)\right]\Big\}\Big|_{\substack{f_x=\frac{t}{\lambda z_3}-\frac{mD_2}{\lambda f_2}\\ f_y=\frac{w}{\lambda z_3}-\frac{nD_2}{\lambda f_2}}}\right|^2.$$

Simulation Results.

We simulated this analysis in Matlab for a general non-fluorescent, point object and tested the effect of varying the axial distances in the system. The focal lengths of the primary lens and the lenslet array were $f_1=51$ mm and $f_2=5$ mm. The primary lens aperture is a pentagon inscribed in a circle of diameter $D_1=10$ mm. The pentagon shape was selected so that pupil effects and object effects would be more evident. The object is at an object distance $z_1=500$ mm from the primary lens. Each lenslet in the multi-lenslet array is circular with a diameter $D_2=0.5$ mm. The ideal distance of the lenslet array from the plane of the primary lens was calculated to be 56.8 mm, based on $z_2=1/(1/f_1-1/z_1)$. The ideal distance for the sensor from the lenslet array is 5.5 mm, given by $z_3=1/(1/f_2-1/z_2)$.

For the sake of brevity, we display simulation results for only the on-axis lenslet and on-axis object point. However, the analysis and simulations remain valid for off-axis object points and lenslets. For example, an on-axis object point will produce a primary image that, if in focus, will produce a focused spot on the on-axis lenslet. A similar situation can be produced for all (or a selected subset) of the lenslets in the array by using an object that is an array of point sources, each point source imaged to a corresponding lenslet.

Figure 2A:
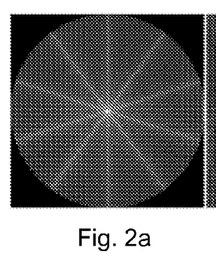
FIGS. 2a-2d are simulated images showing the response of an in-focus system.

In focus system. FIGS. 2a-2d are simulated images showing the response of this system when it is in focus. Under these conditions, the first imaging subsystem is in perfect focus. Hence the on-axis point object is imaged to a tightly focused spot at the plane of the lenslet array, which corresponds to the impulse response of the first imaging subsystem. It is then truncated by the finite extent of the on-axis lenslet. The truncated impulse response is shown in FIG. 2a. The impulse is displayed as $|U_i|^{0.1}$ in FIG. 2a in order to emphasize its dim details. The five streaks radiating from the center of the impulse response correspond to the Fourier transform of the five-sided (pentagon) pupil of the primary lens in our simulations. The pentagon shape was selected purely for illustrative purposes. The circular boundary corresponds to the edge of the circular lenslet.

Figure 2B:
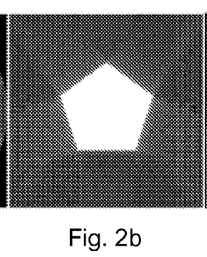
Figure 2C:
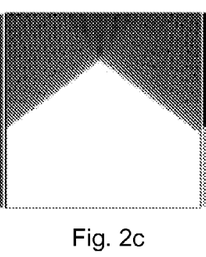
Figure 2D:
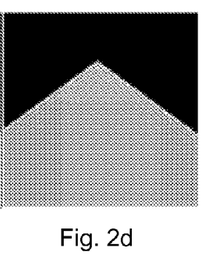

This field $U_i'$ is then propagated to and captured at the sensor as intensity $I_f$, given in Eq. (11). FIGS. 2b-2d show one subimage of the plenoptic image. Since the object is a point source, the subimage is an image of the pentagon shaped pupil of the primary lens. FIG. 2b displays $I_f^{0.1}$ and FIG. 2c shows a magnified portion of this. FIG. 2d shows the same magnified portion as FIG. 2c, but $I_f^{2.5}$ is displayed in order to show the fine rings at the edges due to the truncation. For convenience, we will refer to this image of the pupil, produced by each lenslet for a point object, as the pupil image function (PIF).

In the ideal case where $z_1$, $z_2$ and $z_3$ are in focus, there are fine fringes in the interior of the pupil image function, and the edges have a small sharp overshoot as seen in FIG. 2d. However, overall, the edges of the PIF are sharp and the interior is relatively flat.

Defocus of $z_2$. Now consider the effect of a defocus error in $z_2$. Assuming accurate $z_1$ and $z_3$, we now test the effect of inaccuracy in the value of $z_2$. We retained $z_1=500$ mm and $z_3=5.5$ mm. But instead of 56.8 mm, we use $z_2=54$ mm. FIGS. 3a-3d are simulated images showing the response of the system with defocus in $z_2$.

Figure 3A:
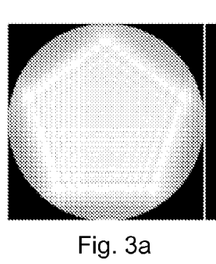
FIGS. 3a-3d are simulated images showing the response of a system with defocus in $z_2$.
Figure 3B:
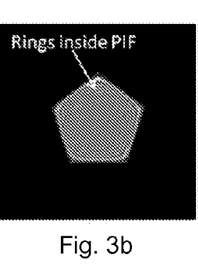
Figure 3C:
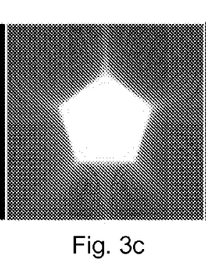
Figure 3D:
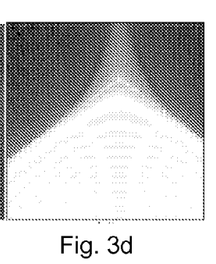

FIG. 3a shows the impulse response of the first imaging subsystem, as truncated by the lenslet. As shown in FIG. 3a, defocus in the value of $z_2$ implies that the lenslet array is placed at an axial position where the impulse response of the first imaging subsystem contains some defocus. Therefore, the lenslet array captures and truncates this defocused impulse response of the primary lens. This is further propagated to the sensor and captured as the pupil image function shown in FIGS. 3b-3d. FIGS. 3b and 3c display $I_f^{2.5}$ and $I_f^{0.1}$, respectively. FIG. 3d is a magnified view of FIG. 3c. The PIF shows ringing in the interior (compare FIGS. 3b and 2b), but FIGS. 3c-3d show that the edges of the pentagon shaped image of the pupil of the primary lens remain relatively sharp. This is probably because, despite the defocus in the first imaging subsystem, the second imaging subsystem which images the pupil of the primary lens at the sensor has greater tolerance to variation in $z_2$ and remains reasonably focused.

Defocus of $z_3$. Now consider the effect of defocus error in $z_3$. Assuming accurate $z_1$ and $z_2$, we now test the effect of inaccuracy in the value of $z_3$. We retained $z_1$=500 mm and $z_2$=56.8 mm. But instead of 5.5 mm, we use $z_3$=5 mm. FIGS. 4a-4d are simulated images showing the response of the system with defocus in $z_3$.

Figure 4A:
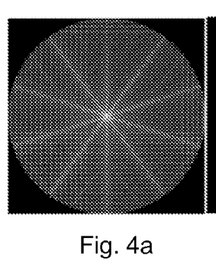
FIGS. 4a-4d are simulated images showing the response of a system with defocus in $z_3$.
Figure 4B:
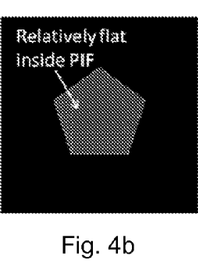
Figure 4C:
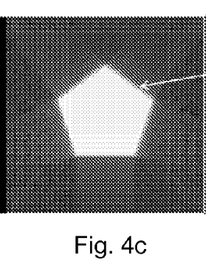
Figure 4D:
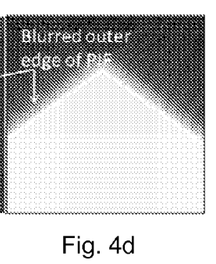

FIG. 4a shows the impulse response of the first imaging subsystem. As expected, inaccuracy in $z_3$ has no influence on the first imaging subsystem. Therefore, the point object is imaged accurately on the lenslet array. However, defocus in $z_3$ creates defocus in the second imaging subsystem. FIGS. 4b and 4c display $I_f^{2.5}$ and $I_f^{0.1}$, respectively. FIG. 4d is a magnified view of FIG. 4c. FIGS. 4c-4d show that the edges of the pentagon shaped pupil image are now blurred, even though the interior of the PIF is relatively flat as shown in FIG. 4b.

Some Applications.

As shown above, blur in the edges of the PIF is an indicator of defocus in $z_3$ and ringing in the interior of the PIF (more generally, the amount of high frequency content in the PIF) is an indicator of defocus in $z_2$. These indicators can be used in a number of different ways. For example, they can be used to help determine the correct axial spacing of the components within a plenoptic imaging system. Depending on which characteristic is observed, either the distance between the primary imaging subsystem and the secondary imaging array ($z_2$) and/or the distance between the secondary imaging array and the sensor array ($z_3$) may be adjusted. This alignment may occur during assembly of the plenoptic imaging system, or it may be implemented as an autofocus or manual focus adjustment of the plenoptic imaging system in the field. Alignment may also occur when an existing imaging system is converted to a plenoptic imaging system by replacing the existing sensor array with a plenoptic sensor module (i.e., secondary imaging array plus sensor array). In that case, the plenoptic sensor module must be aligned to the primary imaging optics in the existing system.

Another use is during the system design process. It is difficult to design a plenoptic imaging system using conventional lens design software because there are not well-defined metrics that capture the quality of a plenoptic imaging system. However, metrics based on the characteristics above can now be used to optimize the plenoptic imaging system with respect to defocus. As a final example application, the characteristics above can be used in an inverse fashion to estimate the object distance $z_1$. If the optimal distances $z_2$ and $z_3$ are known (e.g., by optimizing the blur and high frequency characteristics), then this can be used to estimate object distance $z_1$.

Possible Metrics.

Flatness / high frequency content metrics. Defocus in $z_2$ (i.e., separation of primary imaging subsystem and secondary imaging array) is characterized by ringing in the interior of the PIF. More generally, it is characterized by the amount of high frequency content in the PIF. As $z_2$ comes into focus, the ringing becomes higher frequency and less modulated (i.e., there are more ridges but with a lower contrast, so the interior becomes flatter). This is because the high frequency content in the PIF is increasing. Different metrics can be used to measure these characteristics. For example, metrics can be based on slope analysis for the detection of maxima or minima, counting the number of peaks and valleys of the ringing (i.e., local maxima and minima), spatial frequency analysis (e.g., percent energy contained above a certain frequency, or distribution of energy across frequencies) or flatness of the ringing (e.g., modulation divided by DC level).

Two examples of automated detection of this criterion use image processing functions in Matlab. One example metric counts the peaks in the interior of the PIF with the function "imregionalmax" in Matlab. This function detects the peaks in a local neighborhood. We sum the total number of peaks detected inside the PIF. When the interior of the PIF becomes flatter, the local peaks (ripples) in it become finer and increase in number. Therefore decreasing defocus in $z_2$ should be characterized by an increasing number of local peaks.

Another example metric is based on the Matlab function "edge" with the option of using the "canny" edge detector. This function is less sensitive to fine local variations and detects longer, continuous edges inside the PIF (unlike imregionalmax where the local peaks may be single pixels). As the PIF becomes flatter, the number of these low frequency peak-to-valley ripples decreases since the PIF is dominated more by the fine local variations. Therefore the canny edge detector finds fewer edges as the defocus of $z_2$ decreases.

Blur metric: The blur around the edges of the PIF can be detected, for example, by using sharpness or contrast detection algorithms. One example is based on taking a derivative of the PIF along either the x or y dimension (rows or columns). The PIF whose derivative shows the maximum slope contains the sharpest edges and should indicate the optimal position of $z_3$. In simulations, we used the Matlab function "diff(PIF,1)" to obtain the derivative. The peak-to-valley difference in diff(PIF,1) is approximated to be the greatest slope for that PIF. This slope should increase as the defocus in $z_3$ decreases.

Another blur metric is based on thresholding the edge of the PIF and counting all the pixels that have a value above the selected threshold. As the blur reduces, the number of pixels in the edges should decrease.

Note that this phenomenon has been described using the word "blur," but it should be understood that metrics for sharpness, contrast, etc. may also be measures of blur.

Example Automated Alignment

Figure 5:
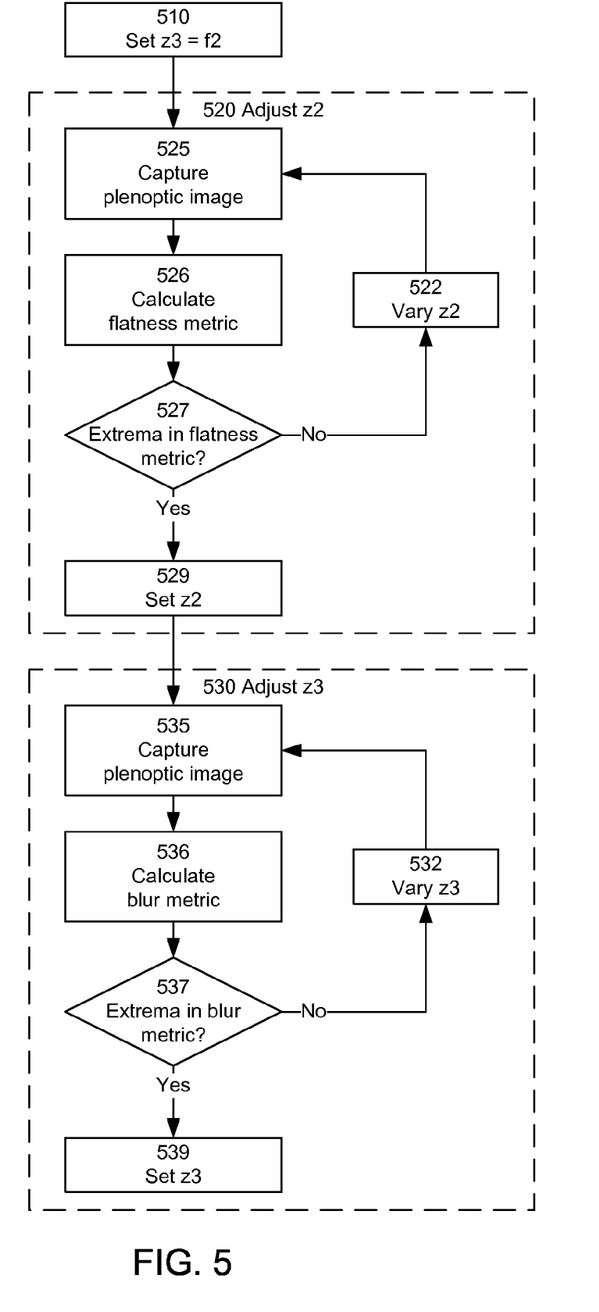
FIG. 5 is a flow diagram for aligning a plenoptic imaging system.

FIG. 5 is a flow diagram for aligning a plenoptic imaging system, based on the principles described above. In this example, it is assumed that the object is at an unknown object distance $z_i$, so that it is not possible to accurately calculate $z_2$ and $z_3$. Instead, $z_2$ and $z_3$ are adjusted as follows. As an initial setting, $z_3$ is set 510 to $f_2$. Then $z_2$ is adjusted 520 based on increasing the high frequency content in the plenoptic image captured by the sensor array. Then $z_3$ is adjusted 530 based on reducing blur in the PIF. Steps 520 and 530 may be iterated, or interchanged. Alternately, $z_2$ and $z_3$ may be adjusted simultaneously based on a metric that accounts for both the high frequency and blur characteristics. More details are given below, using the example plenoptic imaging system introduced previously.

In step 510, the sensor array is moved to the back focal plane of the lenslet array, i.e. $z_3=f_2=5$ mm. This can be done experimentally using collimated light and using the lenslet array to focus it to a tight spot at the sensor.

Figure 6A:
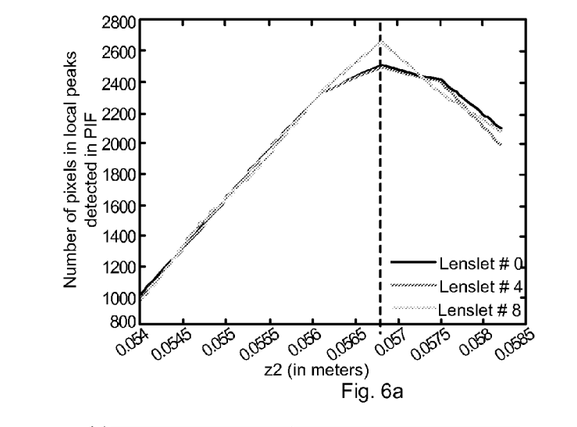
FIG. 6a is a plot of flatness as a function of $z_2$.
Figure 6B:
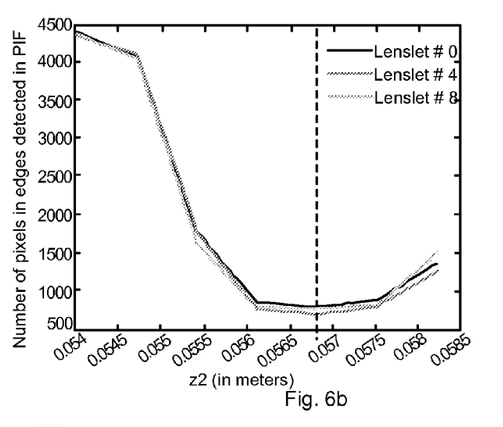
FIG. 6b is a plot of the number of low frequency ripples as a function of $z_2$.

In step 520, we move 522 the lenslet array and sensor array in concert, so that $z_2$ changes while $z_3$ remains constant. The sensor array captures 525 the plenoptic image at different values of $z_2$. A flatness metric is calculated 526 at these different values. In this example, $z_1=500$ mm and $z_3=f_2=5$ mm. FIG. 6a plots the number of pixels in the local peaks detected by imregionalmax for $z_2$~54 mm to 58 mm. This plot shows a maximum at $z_2=56.8$ mm. FIG. 6b plots the number of pixels in the edges detected by the canny edge detector for $z_2$~54 mm to 58 mm. It shows a minimum, also at $z_2=56.8$ mm. These curves for two different metrics both show 527 that the axial position $z_2=56.8$ mm for the lenslet array gives the flattest interior for the PIF. Thus, the lenslet array is set 529 to this location. So $z_1=500$ mm and $z_2=56.8$ mm.

Figure 7A:
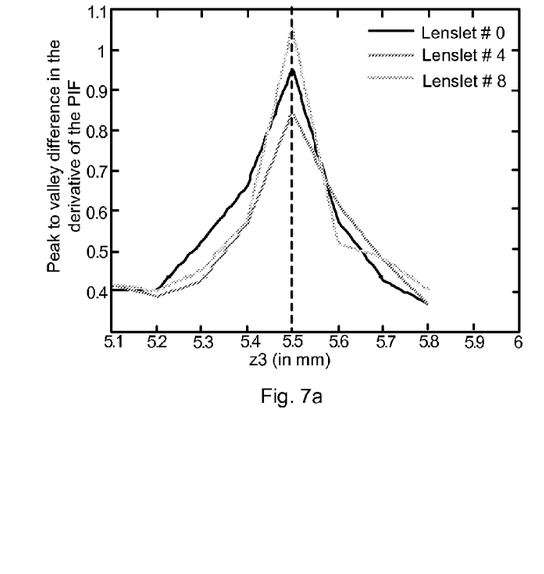
FIG. 7a is a plot of edge sharpness as a function of $z_3$.
Figure 7B:
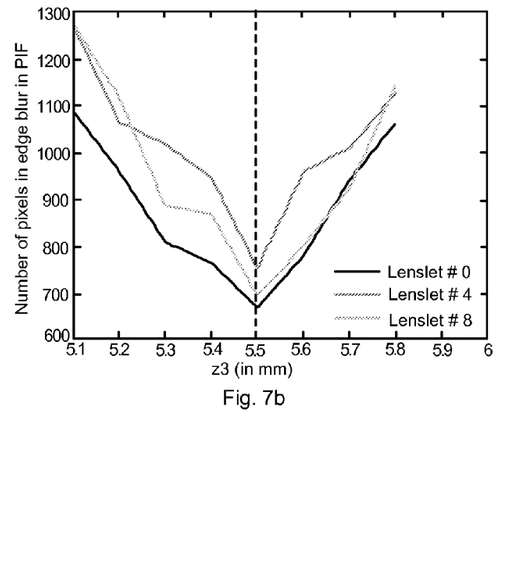
FIG. 7b is a plot of edge width as a function of $z_3$.

In step 530, we move 532 the sensor so that $z_3$ changes. A similar procedure to step 520 is used. The sensor array captures 535 the plenoptic image at different values of $z_3$. The blur metric is calculated 536 at these different values. FIG. 7a plots the max-to-min difference in the derivative of the PIF (along the rows), obtained using the function diff (PIF,1) in Matlab. The plot shows a maximum for $z_3=5.5$ mm. FIG. 7b plots the number of pixels in the thresholded edge blur for $z_3=5.1$ mm to 5.8 mm. It also shows a minimum at $z_3=5.5$ mm. These curves for two different blur metrics both show 537 that the axial position $z_3=5.5$ mm for the sensor array reduces the blur the most. Thus, the sensor array is set 539 to this location.

Note that FIGS. 6-7 each show plots for three different lenslets. Recall that the lenslet array contains multiple lenslets, each of which produces a corresponding subimage within the plenoptic image. This array nature can be addressed in different ways. For example, the various metrics (blur, flatness, high frequency content, etc.) can be calculated for each subimage and these metrics combined into a single metric for optimization. Two common methods for combining are based on averaging (including weighted averaging), or on taking the worst case. Also, the metric can be calculated for all subimages, or for just a subset or sampling of the subimages. Different wavelengths in the plenoptic image can be handled in a similar manner. If the plenoptic imaging system has a fixed position for a range of object distances, then the variation in object distance can also be handled in a similar manner (e.g., by taking some combination of the performances at different object distances). Plenoptic imaging systems are commonly used to effect different filtering for different subimages by placing corresponding filters in the pupil. For example, different wavelength filters may be used at different locations in the pupil. The performance over different subimages can also be handled in a similar manner.

More Applications

Figure 8:
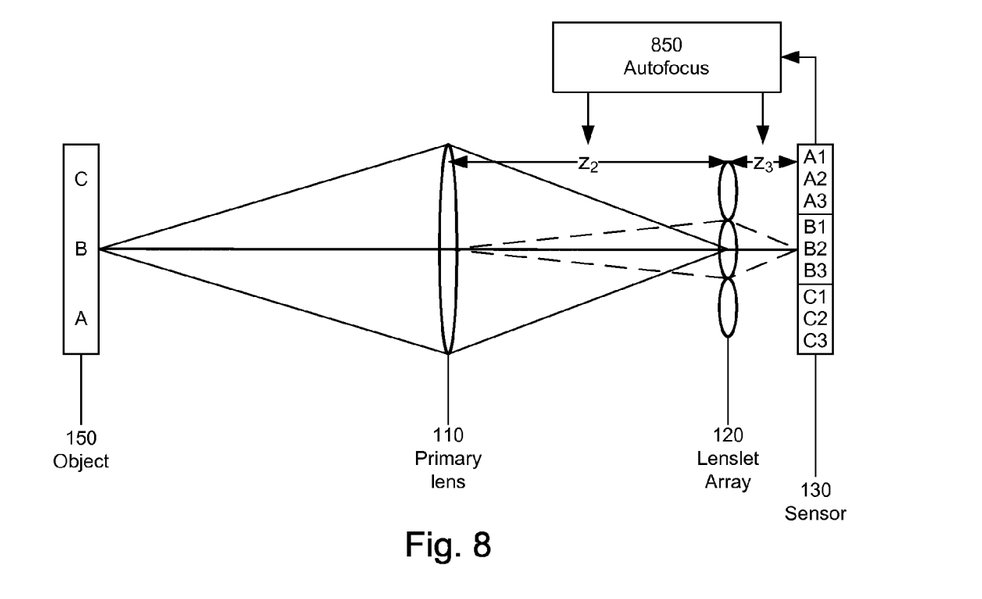
FIG. 8 is a diagram of a plenoptic imaging system with autofocus.

If the plenoptic imaging system is adjustable, then the principles described above can be implemented in an autofocus mechanism. FIG. 8 is a block diagram of a plenoptic imaging system with autofocus. The autofocus mechanism 850 receives the plenoptic image captured by the sensor array 130 and, based on the captured image, adjusts the distances $z_2$ and/or $z_3$. In one approach, the distances are adjusted based on an algorithm such as described in FIG. 5.

In other applications, $z_1$ may be varied in addition to or in place of $z_2$ and/or $z_3$. For example, if the distance from secondary imaging array to sensor array is fixed (i.e., fixed $z_3$), it may be possible to focus the plenoptic imaging system by adjusting the object distance $z_1$.

In another approach, a lookup table lists $z_3$ values that correspond to different values of $z_2$. The distance $z_2$ is determined based on the captured plenoptic image, and distance $z_3$ is determined based on the lookup table.

As another variation, once $z_2$ and/or $z_3$ are determined, they can be used to estimate the object distance $z_1$. The look-up table may be stored in software in hardware/firmware on a chip.

In yet another approach, the plenoptic imaging system is focused, either manually or automatically, by use of a single adjustment. For example, instead of providing one adjustment for $z_2$ and a second adjustment for $z_3$, $z_2$ and $z_3$ may be coupled and varied together through one adjustment. This coupling may be based on the principles described above. A similar approach can be used for cases where other distances from among $z_1$, $z_2$ and $z_3$ are adjustable.

Figure 9A:
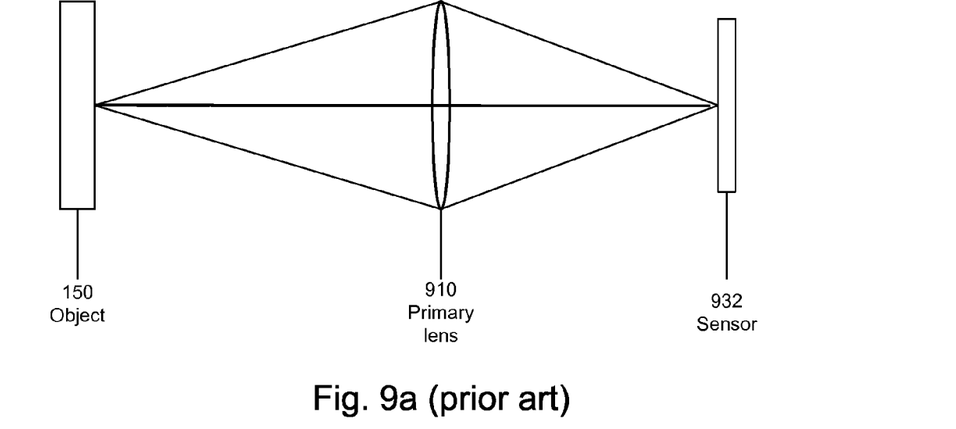
FIG. 9a (prior art) and FIG. 9b are diagrams of a plenoptic sensor module retrofitted to an existing imaging system.
Figure 9B:
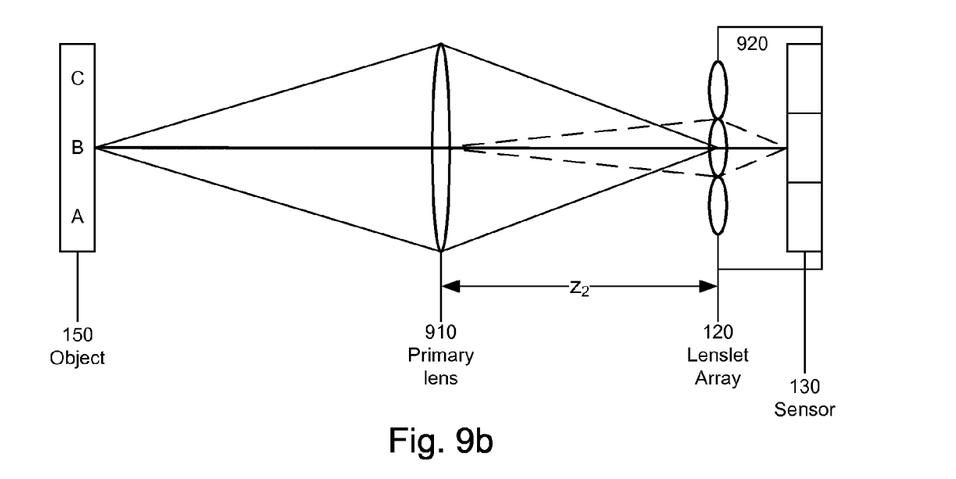

Similar approaches may be used when an existing imaging system is converted to a plenoptic imaging system, as shown in FIGS. 9a-9b. FIG. 9a shows the existing imaging system, which includes a primary lens 910 and a sensor array 932 that captures the conventional primary image. As shown in FIG. 9b, the conventional sensor array 932 is replaced by a plenoptic sensor module 920, which includes a secondary imaging array 120 and sensor array 130. Retrofit of the plenoptic sensor module includes alignment of the module with the primary imaging subsystem 910, as described above.

Figure 10:
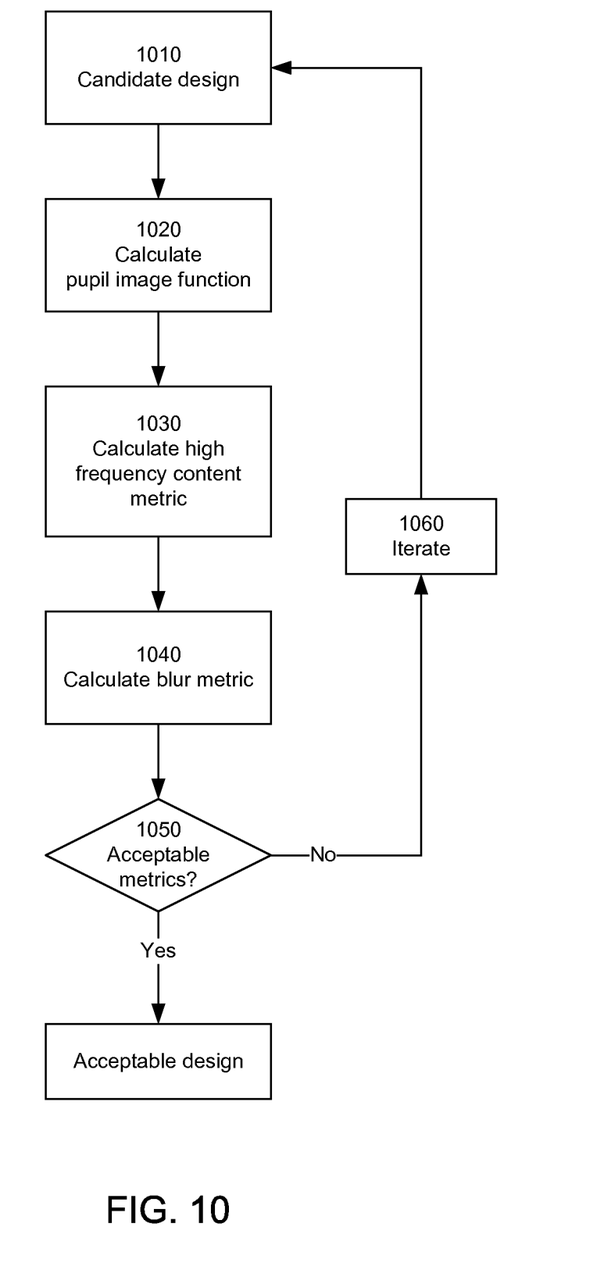
FIG. 10 is a flow diagram for designing a plenoptic imaging system.

In another aspect, the principles described can also be used during the design phase, as shown in the flow diagram of FIG. 10. The pupil image function for a candidate design 1010 is calculated 1020. The PIF is used to calculate a high frequency content metric 1030 and/or a blur metric 1040. If the metrics are sufficiently good, then the lens design is completed 1050. Otherwise, the design is iterated 1060. Other approaches can also be used. For example, different metrics or combinations of metrics could be used. Only the high frequency content metric or only the blur metric could be used, or a metric that combines the two or combines these metrics with other metrics (such as rms wavefront error or spot size) could be used. As another alternative, the metrics could be evaluated without directly calculating the pupil image function.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A computer-implemented method for automatically designing a plenoptic imaging system, comprising:
   accessing a candidate design for the plenoptic imaging system, the plenoptic imaging system comprising a primary imaging subsystem, a secondary imaging array, and a location for a sensor array;
   simulating a plenoptic image formed by the candidate design;
   calculating a metric that is a function of the high frequency content in the plenoptic image; and
   adjusting the candidate design, based on improving the metric in a manner that increases the high frequency content in the plenoptic image; wherein adjusting the candidate design comprises adjusting a distance $z_2$ to position the secondary imaging array at the primary image location of the primary imaging subsystem, wherein $z_2$ is a distance between the primary imaging subsystem and the secondary imaging array, said $z_2$ adjustment based on improving the metric in a manner that increases the high frequency content in the plenoptic image.

2. The computer-implemented method of claim 1 wherein adjusting the distance $z_2$ is based on improving the metric in a manner that increases a frequency of ringing in the plenoptic image.

3. The computer-implemented method of claim 1 wherein adjusting the distance $z_2$ is based on improving the metric in a manner that increases a number of ripples caused by ringing in the plenoptic image.

4. The computer-implemented method of claim 1 wherein adjusting the distance $z_2$ is based on improving the metric in a manner that increases a flatness of ringing in the plenoptic image.

5. The computer-implemented method of claim 1 wherein the metric accounts for high frequency content in a plurality of subimages within the plenoptic image.

6. The computer-implemented method of claim 1 wherein the metric accounts for high frequency content in a plurality of wavelengths within the plenoptic image.

7. The computer-implemented method of claim 1 wherein the plenoptic imaging system includes different wavelength filters for different subimages within the plenoptic image.

8. The computer-implemented method of claim 1 wherein simulating the plenoptic image comprises simulating a plenoptic image formed by an array of point objects.

9. A computer-implemented method for automatically designing a plenoptic imaging system, comprising:
   accessing a candidate design for the plenoptic imaging system, the plenoptic imaging system comprising a primary imaging subsystem, a secondary imaging array, and a location for a sensor array;
   simulating a plenoptic image formed by the candidate design;
   calculating a metric that is a function of the high frequency content in the plenoptic image; and
   adjusting the candidate design, based on improving the metric in a manner that increases the high frequency content in the plenoptic image; wherein the metric is also a function of a blur in a pupil image function of the plenoptic imaging system; and adjusting the candidate design further comprises adjusting a distance $z_3$ to position the location of the sensor array at the pupil image location of the secondary imaging array, wherein $z_3$ is a distance between the secondary imaging array and the sensor array, said $z_3$ adjustment based on improving the metric in a manner that reduces the blur in the pupil image function of the plenoptic imaging system.

10. The computer-implemented method of claim 9 wherein the plenoptic imaging system includes different wavelength filters for different subimages within the plenoptic image.

11. The computer-implemented method of claim 9 wherein simulating the plenoptic image comprises simulating a plenoptic image formed by an array of point objects.

12. A non-transitory computer readable medium containing computer readable instructions that, when executed by a computer, cause the computer to perform a method for automatically designing a plenoptic imaging system, the method comprising:
   accessing a candidate design for the plenoptic imaging system, the plenoptic imaging system comprising a primary imaging subsystem, a secondary imaging array, and a location for a sensor array;
   simulating a plenoptic image formed by the candidate design;
   calculating a metric that is a function of the high frequency content in the plenoptic image; and
   adjusting the candidate design, based on improving the metric in a manner that increases the high frequency content in the plenoptic image; wherein adjusting the candidate design comprises adjusting a distance $z_2$ to position the secondary imaging array at the primary image location of the primary imaging subsystem, wherein $z_2$ is a distance between the primary imaging subsystem and the secondary imaging array, said $z_2$ adjustment based on improving the metric in a manner that increases the high frequency content in the plenoptic image.

13. The computer readable medium of claim 12 wherein adjusting the distance $z_2$ is based on improving the metric in a manner that increases a frequency of ringing in the plenoptic image.

14. The computer readable medium of claim 12 wherein adjusting the distance $z_2$ is based on improving the metric in a manner that increases a number of ripples caused by ringing in the plenoptic image.

15. The computer readable medium of claim 12 wherein adjusting the distance $z_2$ is based on improving the metric in a manner that increases a flatness of ringing in the plenoptic image.

16. The computer readable medium of claim 12 wherein the metric accounts for high frequency content in a plurality of subimages within the plenoptic image.

17. The computer readable medium of claim 12 wherein the metric accounts for high frequency content in a plurality of wavelengths within the plenoptic image.

18. The computer readable medium of claim 12 wherein the plenoptic imaging system includes different wavelength filters for different subimages within the plenoptic image.

19. The computer readable medium of claim 12 wherein:
   the metric is also a function of a blur in a pupil image function of the plenoptic imaging system; and
   adjusting the candidate design further comprises adjusting a distance $z_3$ to position the location of the sensor array at the pupil image location of the secondary imaging array, wherein $z_3$ is a distance between the secondary imaging array and the location of the sensor array, said $z_3$ adjustment based on improving the metric in a manner that reduces the blur in the pupil image function of the plenoptic imaging system.

20. The computer readable medium of claim 12 wherein simulating a plenoptic image comprises simulating a plenoptic image formed by an array of point objects.

* * * * *